United States Patent
Yasui et al.

(10) Patent No.: US 9,558,315 B2
(45) Date of Patent: Jan. 31, 2017

(54) METHOD OF GENERATING WRITE DATA, MULTI CHARGED PARTICLE BEAM WRITING APPARATUS, AND PATTERN INSPECTION APPARATUS

(71) Applicant: NuFlare Technology, Inc., Yokohama-shi (JP)

(72) Inventors: Kenichi Yasui, Kawasaki (JP); Shigehiro Hara, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/794,060

(22) Filed: Jul. 8, 2015

(65) Prior Publication Data

US 2016/0103945 A1 Apr. 14, 2016

(30) Foreign Application Priority Data

Oct. 8, 2014 (JP) ................. 2014-207332

(51) Int. Cl.
*H01J 37/00* (2006.01)
*G06F 17/50* (2006.01)
*H01J 37/317* (2006.01)
*H01J 37/302* (2006.01)

(52) U.S. Cl.
CPC ....... *G06F 17/5081* (2013.01); *G06F 17/5072* (2013.01); *H01J 37/3026* (2013.01); *H01J 37/3177* (2013.01); *H01J 2237/31764* (2013.01)

(58) Field of Classification Search
CPC ... G06F 17/5081; G06F 17/5072; H01J 37/26; H01J 37/3177; H01J 37/3026; H01J 2237/31723

USPC ............................................. 250/492.1-492.3
See application file for complete search history.

(56) References Cited

U.S. PATENT DOCUMENTS

2008/0172438 A1* 7/2008 Kasahara ............ G06F 17/5081
708/801
2012/0286174 A1* 11/2012 Gomi ................. H01J 37/3026
250/492.3

FOREIGN PATENT DOCUMENTS

| JP | 4068081 | 3/2008 |
| JP | 2009-109580 | 5/2009 |
| JP | 2012-129479 | 7/2012 |

* cited by examiner

*Primary Examiner* — Michael Maskell
(74) *Attorney, Agent, or Firm* — Oblon, McClelland, Maier & Neustadt, L.L.P.

(57) ABSTRACT

In one embodiment, a method of generating write data generates write data for a multi charged particle beam writing apparatus. The method includes dividing a polygonal figure included in design data into a plurality of figure segments including trapezoids each having a pair of parallel opposite sides extending in a first direction, the trapezoids being connected in a second direction orthogonal to the first direction such that adjacent trapezoids share the side extending in the first direction as a common side, and generates the write data including position information of a common vertex of a first trapezoid and a second trapezoid next to the first trapezoid expressed by a displacement in the first and second directions from a position of a common vertex of the second trapezoid and a third trapezoid next to the second trapezoid.

20 Claims, 11 Drawing Sheets

FIG.2
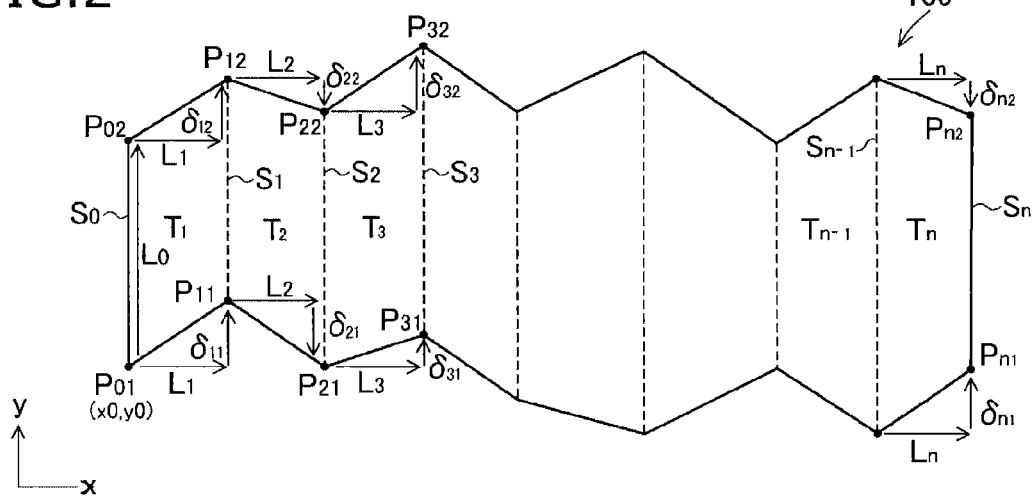
FIG.3A
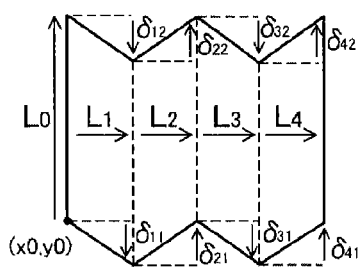
FIG.3B
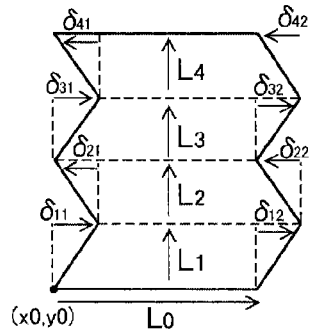
FIG.3C
| PH | Code |
|---|---|
| | flag |
| | N |
| EP | x0 |
| | y0 |
| | L0 |
| | 4(=Nconnect) |
| | L1 |
| | $\delta_{11}$ |
| | $\delta_{12}$ |
| | L2 |
| | $\delta_{21}$ |
| | $\delta_{22}$ |
| | L3 |
| | $\delta_{31}$ |
| | $\delta_{32}$ |
| | L4 |
| | $\delta_{41}$ |
| | $\delta_{42}$ |

FIG.4A
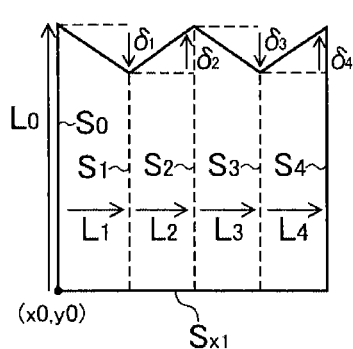
FIG.4B
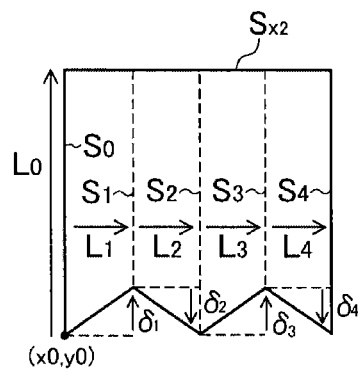
FIG.4C
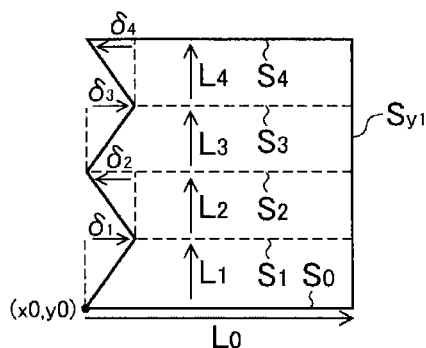
FIG.4D
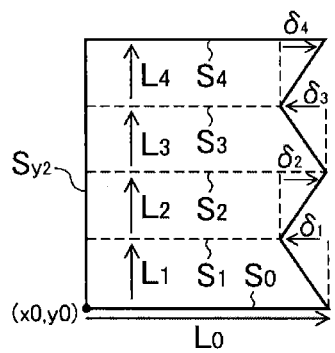
FIG.4E
| PH | Code |
| --- | --- |
| | flag |
| | N |
| EP | x0 |
| | y0 |
| | L0 |
| | 4(=Nconnect) |
| | L1 |
| | $\delta_1$ |
| | L2 |
| | $\delta_2$ |
| | L3 |
| | $\delta_3$ |
| | L4 |
| | $\delta_4$ |

FIG.5A
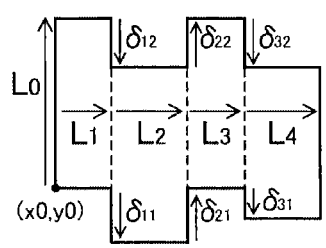
FIG.5B
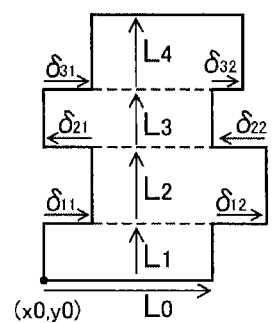
FIG.5C
| PH | Code |
|---|---|
| | flag |
| | N |
| EP | x0 |
| | y0 |
| | L0 |
| | 4(=Nconnect) |
| | L1 |
| | $\delta_{11}$ |
| | $\delta_{12}$ |
| | L2 |
| | $\delta_{21}$ |
| | $\delta_{22}$ |
| | L3 |
| | $\delta_{31}$ |
| | $\delta_{32}$ |
| | L4 |

FIG.6A
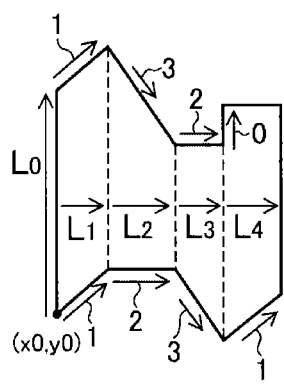
FIG.6B
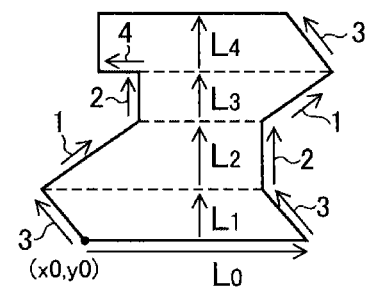
FIG.6C
| PH | Code |
|---|---|
| | flag |
| | N |
| EP | x0 |
| | y0 |
| | L0 |
| | 4(=Nconnect) |
| | L1 |
| | 1(=DIRECTION FLAG) |
| | 1(=DIRECTION FLAG) |
| | L2 |
| | 2(=DIRECTION FLAG) |
| | 3(=DIRECTION FLAG) |
| | L3 |
| | 3(=DIRECTION FLAG) |
| | 2(=DIRECTION FLAG) |
| | L4 |
| | 1(=DIRECTION FLAG) |
| | 0(=DIRECTION FLAG) |
FIG.6D
| CONNECTING DIRECTION: HORIZONTAL | CONNECTING DIRECTION: VERTICAL |
|---|---|
| | |

FIG.7A

| PH | Code |
|---|---|
|  | flag |
|  | N |
| EP | x$_0$ |
|  | y$_0$ |
|  | L$_0$ |
|  | Nconnect |
|  | L$_1$ |
|  | $\delta_{11}$ |
|  | $\delta_{12}$ |
|  | L$_2$ |
|  | $\delta_{21}$ |
|  | $\delta_{22}$ |
|  | ⋮ |
|  | L$_n$ |
|  | $\delta_{n1}$ |
|  | $\delta_{n2}$ |

FIG.7B

| PH | Code |
|---|---|
|  | flag |
|  | N |
| EP1 | x$_0$ |
|  | y$_0$ |
|  | L$_0$ |
|  | Nconnect |
|  | L$_1$ |
|  | $\delta_{11}$ |
|  | $\delta_{12}$ |
|  | L$_2$ |
|  | $\delta_{21}$ |
|  | $\delta_{22}$ |
|  | ⋮ |
|  | L$_n$ |
|  | $\delta_{n1}$ |
|  | $\delta_{n2}$ |
| EP2 | x1 |
|  | y1 |
|  | ⋮ |
| EPN | ⋮ |

| PH | Code |
| | flag |
| | N |
| PHd | Code \| flag \| N |
| | $AI_1$ |
| | $AI_2$ |
| | ⋮ |
| | $AI_n$ |
| EP | $x_0$ |
| | $y_0$ |
| | $L_0$ |
| | Nconnect |
| | $L_1$ |
| | $\delta_{11}$ |
| | $\delta_{12}$ |
| | $L_2$ |
| | $\delta_{21}$ |
| | $\delta_{22}$ |
| | ⋮ |
| | $L_n$ |
| | $\delta_{n1}$ |
| | $\delta_{n2}$ |

FIG.12A

| PH | Code | |
|---|---|---|
| | flag | |
| | N | |
| EP | x₀ | |
| | y₀ | |
| | L₀ | |
| | Nconnect | |
| | flag1 | L1 |
| | flag2 | $\delta_{11}$ |
| | flag3 | $\delta_{12}$ |
| | flag1 | L2 |
| | flag2 | $\delta_{21}$ |
| | flag3 | $\delta_{22}$ |
| | ⋮ | |
| | flag1 | Ln |
| | flag2 | $\delta_{n1}$ |
| | flag3 | $\delta_{n2}$ |

FIG.12B

| | | |
|---|---|---|
| flag1 | 00 | BOTH ENDS (WITH $\delta_{n1}$ AND $\delta_{n2}$) |
| | 01 | NO ENDS (WITHOUT $\delta_{n1}$ AND $\delta_{n2}$) |
| | 10 | ONE END, LOWER (LEFT) (WITH ONLY $\delta_{n1}$) |
| | 11 | ONE END, UPPER (RIGHT) (WITH ONLY $\delta_{n2}$) |
| flag2 | 00 | UPPER RIGHT BY 45° |
| | 01 | RIGHT ANGLE |
| | 10 | LOWER RIGHT BY 45° |
| | 11 | ANY ANGLE |
| flag3 | 00 | UPPER RIGHT BY 45° |
| | 01 | RIGHT ANGLE |
| | 10 | LOWER RIGHT 45° |
| | 11 | ANY ANGLE |

| PH | Code |  |
|---|---|---|
|  | flag |  |
|  | N |  |
| EP | $x_0$ |  |
|  | $y_0$ |  |
|  | $L_0$ |  |
|  | Nconnect |  |
|  | 10 | $L_1$ |
|  | 11 | $\delta_{11}$ |
|  | 11 | $L_2$ |
|  | 11 | $\delta_{22}$ |
|  | 10 | $L_3$ |
|  | 11 | $\delta_{31}$ |
|  | ⋮ | |
|  | 00 | $L_n$ |
|  | 11 | $\delta_{n1}$ |
|  | 11 | $\delta_{n2}$ |

METHOD OF GENERATING WRITE DATA, MULTI CHARGED PARTICLE BEAM WRITING APPARATUS, AND PATTERN INSPECTION APPARATUS

CROSS REFERENCE TO RELATED APPLICATION

This application is based upon and claims benefit of priority from the Japanese Patent Application No. 2014-207332, filed on Oct. 8, 2014, the entire contents of which are incorporated herein by reference.

FIELD

The present invention relates to a method of generating write data, a multi charged particle beam writing apparatus, and a pattern inspection apparatus.

BACKGROUND

As LSI circuits are increasing in density, circuit linewidths of semiconductor devices are becoming finer year by year. To form a desired circuit pattern on a semiconductor device, a method is used which includes reducing the size of a high-accuracy original pattern (mask or also called a reticle which is used, in particular, in a stepper or a scanner) formed on quartz and transferring the pattern to a wafer with a reduced projection exposure apparatus. The high-accuracy original pattern is written through an electron beam writing apparatus by means of so-called electron beam lithography technology.

Known electron beam writing apparatuses include a multi-beam writing apparatus that performs multi-beam irradiation, or irradiation with multiple beams at one time to improve throughput. In such a multi-beam writing apparatus, for example, an electron beam emitted from an electron gun passes through an aperture member having a plurality of holes, thus forming multiple beams. Each of the beams is blanking-controlled in a blanking plate. The beams which have not been blocked are reduced in size by an optical system and are then applied at desired positions on a mask, serving as a writing target.

For electron beam writing with the multi-beam writing apparatus, the layout of a semiconductor integrated circuit is designed and design data is generated as layout data. A polygonal figure included in the design data is divided into a plurality of trapezoids, thus generating write data to be input to the multi-beam writing apparatus. The write data includes, for each trapezoid, coordinate data indicative of a placement origin corresponding to one vertex of the trapezoid and data indicative of displacements from the placement origin to the other three vertices of the trapezoid.

If design data includes a figure, such as an oval figure, approximately represented with a polygonal figure having many sides, the polygonal figure will be divided into many trapezoids, resulting in an enormous amount of write data which includes, for each of the many trapezoids, coordinate data indicative of a placement origin and data indicative of displacements from the placement origin to the other three vertices.

The amount of the write data can be reduced by representing the polygonal figure with polygons. If such write data is input to the multi-beam writing apparatus, however, the amount of calculation necessary for data processing, such as rasterization, in the apparatus will increase.

BRIEF DESCRIPTION OF THE DRAWINGS

FIG. 2 is a diagram illustrating an exemplary polygonal figure segmentation process.

FIGS. 3A and 3B are diagrams each illustrating an exemplary polygonal figure segmentation process, and FIG. 3C is a diagram illustrating an exemplary data structure of write data.

FIGS. 4A, 4B, 4C, and 4D are diagrams each illustrating an exemplary polygonal figure segmentation process, and FIG. 4E is a diagram illustrating an exemplary data structure of write data.

FIGS. 5A and 5B are diagrams each illustrating an exemplary polygonal figure segmentation process, and FIG. 5C is a diagram illustrating an exemplary data structure of write data.

FIGS. 6A and 6B are diagrams each illustrating an exemplary polygonal figure segmentation process, FIG. 6C is a diagram illustrating an exemplary data structure of write data, and FIG. 6D is a diagram illustrating exemplary direction flags.

FIGS. 7A and 7B are diagrams each illustrating an exemplary data structure of write data.

FIG. 12A is a diagram illustrating an exemplary data structure of write data and FIG. 12B is a diagram illustrating exemplary flags.

DETAILED DESCRIPTION

In one embodiment, a method of generating write data generates write data for a multi charged particle beam writing apparatus. The method includes dividing a polygonal figure included in design data into a plurality of figure segments including trapezoids each having a pair of parallel opposite sides extending in a first direction, the trapezoids being connected in a second direction orthogonal to the first direction such that adjacent trapezoids share the side extending in the first direction as a common side, and generates the write data including position information of a common vertex of a first trapezoid and a second trapezoid next to the first trapezoid expressed by a displacement in the first and second directions from a position of a common vertex of the second trapezoid and a third trapezoid next to the second trapezoid.

An embodiment of the present invention will be described with reference to the drawings.

Figure 1:
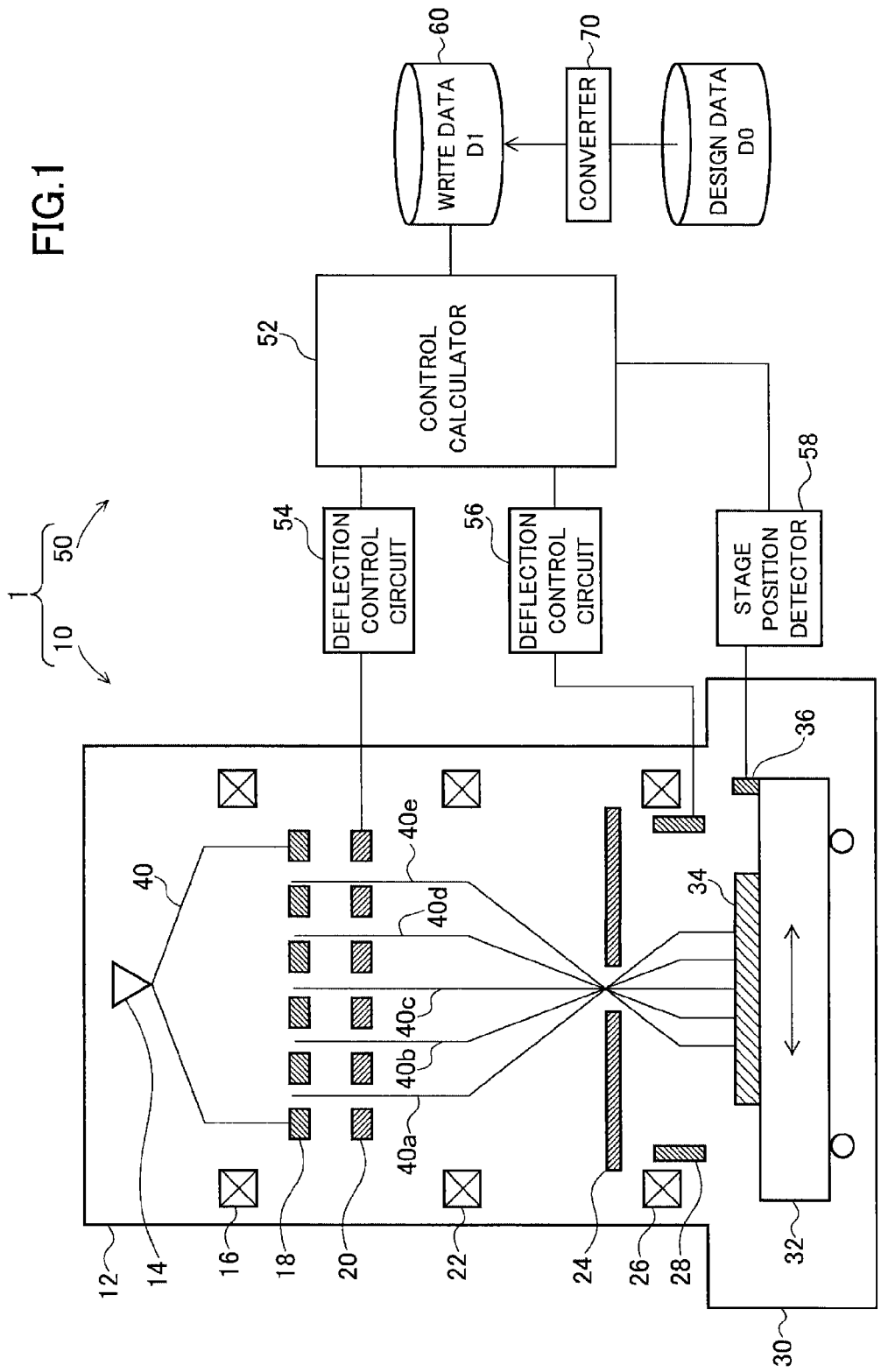
FIG. 1 is a schematic diagram of a multi charged particle beam writing apparatus according to an embodiment of the present invention.

FIG. 1 is a schematic diagram of a multi charged particle beam writing apparatus for writing based on write data according to the present embodiment. In this embodiment, a configuration with an electron beam as an example of a charged particle beam will be described. The charged particle beam is not limited to the electron beam. Any other charged particle beam, such as an ion beam, may be used.

A writing apparatus 1 illustrated in FIG. 1 includes a writing unit 10 that irradiates an object, such as a mask or a wafer, with an electron beam to write a desired pattern on the object and a control unit 50 that controls a writing operation of the writing unit 10. The writing unit 10 includes an electron beam lens barrel 12 and a writing chamber 30.

The electron beam lens barrel 12 accommodates an electron gun 14, a condensing lens 16, an aperture member 18, a blanking plate 20, a reducing lens 22, a limiting aperture member 24, an objective lens 26, and a deflector 28. The writing chamber 30 accommodates an XY stage 32. A mask blank 34, serving as a writing target substrate, is mounted on the XY stage 32. Examples of objects include a wafer and an exposure mask for pattern transfer to a wafer with a reduced projection exposure apparatus or an extreme ultraviolet exposure apparatus, such as a stepper or a scanner, including an excimer laser as a light source. Examples of writing target substrates include a mask with a pattern which has already been written. For example, a Levenson type mask requires two writing operations. A second pattern may be written to an object, serving as a processed mask on which a first pattern has already been written. In addition, a mirror 36 for measuring the position of the XY stage 32 is disposed on the XY stage 32.

The control unit 50 includes a control calculator 52, deflection control circuits 54 and 56, and a stage position detector 58. The control calculator 52, the deflection control circuits 54 and 56, and the stage position detector 58 are connected by a bus.

The condensing lens 16 allows an electron beam 40 emitted from the electron gun 14 to be applied substantially perpendicular to the entirety of the aperture member 18. The aperture member 18 has holes (openings) arranged in a matrix form at a predetermined pitch. The electron beam 40 is applied to an area including all of the holes of the aperture member 18. The electron beam 40 partly passes through these holes, thus forming multiple beams 40a to 40e as illustrated in FIG. 1.

The blanking plate 20 has passage holes aligned with the holes arranged in the aperture member 18. Each of the passage holes is provided with a blanker composed of two electrodes paired. Each of the electron beams 40a to 40e passing through the passage holes can be independently deflected by a voltage applied by the blanker. Such deflection achieves blanking control. As described above, some of the blankers perform blanking deflection of corresponding beams of the multiple beams passing through the holes of the aperture member 18.

The multiple beams 40a to 40e passing through the blanking plate 20 are reduced by the reducing lens 22 and then travel toward a central hole of the limiting aperture member 24. The electron beams deflected by the blankers of the blanking plate 20 are deviated from the central hole of the limiting aperture member 24 and are interrupted by the limiting aperture member 24. The electron beams, which have not been deflected by the blankers of the blanking plate 20, pass through the central hole of the limiting aperture member 24.

As described above, the limiting aperture member 24 interrupts the beams deflected in a beam-OFF mode by the blankers of the blanking plate 20. The beams passing through the limiting aperture member 24 for a period between the time when the beams enter a beam-ON mode and the time when the beams are changed to the beam-OFF mode correspond to a single shot of beam irradiation. The multiple beams 40a to 40e passed through the limiting aperture member 24 are focused by the objective lens 26, thus forming a pattern image reduced with a desired reduction rate. The beams (the whole of the multiple beams) passing through the limiting aperture member 24 are collectively deflected in the same direction by the deflector 28 and are then applied at beam irradiation positions on the mask blank 34.

While the XY stage 32 is continuously moved, the deflector 28 controls the beams such that the beam irradiation positions follow movement of the XY stage 32. The XY stage 32 is moved by a stage controller (not illustrated). The position of the XY stage 32 is detected by the stage position detector 58.

The multiple beams applied at one time are arranged at a pitch ideally obtained by multiplying the arrangement pitch of the holes of the aperture member 18 by the above-described desired reduction rate. The writing apparatus performs the writing operation in a raster scanning manner such that a shot of beams is successively and sequentially applied. To write a desired pattern, beams necessary for the pattern are blanking-controlled so as to enter the beam-ON mode.

The control calculator 52 reads write data D1 from a memory 60 and subjects the write data D1 to a multi-stage data conversion process, thus generating shot data specific to the apparatus. In the shot data, for example, an amount of radiation for each shot and the coordinates of each irradiation position are defined.

The control calculator 52 outputs data indicative of the amount of radiation for each shot based on the shot data to the deflection control circuit 54. The deflection control circuit 54 divides the amount of radiation, indicated by the input data, by a current density, thus obtaining irradiation time t. To achieve each shot, the deflection control circuit 54 applies a deflection voltage to the blankers, associated with the shot, in the blanking plate 20 so that the blankers provide the beam-ON mode only for the irradiation time t.

In addition, the control calculator 52 outputs deflection position data to the deflection control circuit 56 so that each beam is deflected to a position (coordinates) indicated by the shot data. The deflection control circuit 56 calculates an amount of deflection and applies a deflection voltage to the deflector 28. Consequently, the multiple beams corresponding to a shot at that time are collectively deflected.

A method of generating write data D1 will now be described. The layout of a semiconductor integrated circuit is designed and design data (CAD data) D0, serving as layout data, is generated. The design data D0 is converted by a converter 70, thus generating write data D1 to be input to the control calculator 52 of the writing apparatus 1.

The design data D0 includes a polygonal figure. The converter 70 performs a segmentation process of dividing the polygonal figure into a plurality of trapezoids. Each of the trapezoids generated by the segmentation process has a pair of parallel opposite sides extending in a first direction (e.g., a vertical direction). The trapezoids are connected in a second direction (e.g., a horizontal direction) orthogonal to the first direction. Two adjacent connected trapezoids share the side extending in the first direction as a common side.

For example, as illustrated in FIG. 2, a polygonal FIG. 100 is divided into a plurality of trapezoids $T_1$ to $T_n$, where n is an integer greater than or equal to two, by a segmentation process. The trapezoids $T_1$ to $T_n$ each have a pair of parallel opposite sides extending in the vertical direction (y direction) and are connected in the horizontal direction (x direction). For example, the trapezoid $T_2$ has a pair of parallel sides $S_1$ and $S_2$. The side $S_1$ is a common side shared with the trapezoid $T_1$ and the side $S_2$ is a common side shared with the trapezoid $T_3$. A side $S_0$ of the trapezoid $T_1$ and a side $S_n$ of the trapezoid $T_n$ at both ends in a connecting direction are not common sides.

Various segmentation processes as illustrated in FIGS. 3A, 3B, 4A to 4D, 5A, 5B, 6A, and 6B are performed depending on the shape of a polygonal figure.

FIG. 3A illustrates a segmentation process performed such that trapezoids each have a pair of parallel opposite sides extending in the vertical direction and are connected in the horizontal direction in a manner similar to FIG. 2. FIG. 3B illustrates a segmentation process performed such that trapezoids each have a pair of parallel opposite sides extending in the horizontal direction and are connected in the vertical direction.

FIG. 4A illustrates a polygonal figure having parallel sides $S_0$ and $S_4$ extending in the vertical direction and a side $S_{x1}$ extending in the horizontal direction and connecting lower ends of the sides $S_0$ and $S_4$. A plurality of trapezoids, generated by a segmentation process, each have a pair of parallel opposite sides extending in the vertical direction and are connected in the horizontal direction such that lower sides of the trapezoids are aligned so as to form a straight line in the horizontal direction.

FIG. 4B illustrates a polygonal figure having parallel sides $S_0$ and $S_4$ extending in the vertical direction and a side $S_{x2}$ extending in the horizontal direction and connecting upper ends of the sides $S_0$ and $S_4$. A plurality of trapezoids, generated by a segmentation process, each have a pair of parallel opposite sides extending in the vertical direction and are connected in the horizontal direction such that upper sides of the trapezoids are aligned so as to form a straight line in the horizontal direction.

FIG. 4C illustrates a polygonal figure having parallel sides $S_0$ and $S_4$ extending in the horizontal direction and a side $S_{y1}$ extending in the vertical direction and connecting right ends of the sides $S_0$ and $S_4$. A plurality of trapezoids, generated by a segmentation process, each have a pair of parallel opposite sides extending in the horizontal direction and are connected in the vertical direction such that right sides of the trapezoids are aligned so as to form a straight line in the vertical direction.

FIG. 4D illustrates a polygonal figure having parallel sides $S_0$ and $S_4$ extending in the horizontal direction and a side $S_{y2}$ extending in the vertical direction and connecting left ends of the sides $S_0$ and $S_4$. A plurality of trapezoids, generated by a segmentation process, each have a pair of parallel opposite sides extending in the horizontal direction and are connected in the vertical direction such that left sides of the trapezoids are aligned so as to form a straight line in the vertical direction.

FIGS. 5A and 5B each illustrate a segmentation process performed such that a polygonal figure has sides extending in the horizontal and vertical directions. In such a case, the polygonal figure is divided into a plurality of oblongs (rectangles). FIG. 5A illustrates a case where the oblongs generated by segmentation are connected in the horizontal direction. FIG. 5B illustrates a case where the oblongs generated by segmentation are connected in the vertical direction.

FIGS. 6A and 6B each illustrate a segmentation process performed such that a polygonal figure has sides extending in the horizontal and vertical directions and sides at an angle of 45° to the vertical direction (or the horizontal direction). FIG. 6A illustrates a case where trapezoids generated by segmentation are connected in the horizontal direction. FIG. 6B illustrates a case where trapezoids generated by segmentation are connected in the vertical direction.

After dividing a polygonal figure into trapezoids, the converter 70 generates write data D1 including position information of a vertex of each trapezoid expressed by a displacement from the position of a vertex of a neighboring trapezoid. For example, in the case illustrated in FIG. 2, the coordinates (x0, y0) of a vertex $P_{01}$ at a lower end of the side $S_0$ is defined as a figure placement position origin of the polygonal figure.

The position (position information) of a vertex $P_{02}$ at an upper end of the side $S_0$ is defined by the figure placement position origin $P_{01}$ and a length $L_0$ of the side $S_0$ extending vertically from the origin.

The position of a vertex $P_{11}$ at a lower end of the side $S_1$ parallel to and next to the side $S_0$ is defined by a height (distance between the side $S_0$ and the side $S_1$) $L_1$ of the trapezoid $T_1$ and a displacement $\delta_{11}$ in the vertical direction from the neighboring vertex $P_{01}$. In addition, the position of a vertex $P_{12}$ at an upper end of the side $S_1$ is defined by the height $L_1$ of the trapezoid $T_1$ and a displacement $\delta_{12}$ in the vertical direction from the neighboring vertex $P_{02}$.

The position of a vertex $P_{21}$ at a lower end of the side $S_2$ parallel to and next to the side $S_1$ is defined by a height $L_2$ of the trapezoid $T_2$ and a displacement $\delta_{21}$ in the vertical direction from the neighboring vertex $P_{11}$. In addition, the position of a vertex $P_{22}$ at an upper end of the side $S_2$ is defined by the height $L_2$ of the trapezoid $T_2$ and a displacement $\delta_{22}$ in the vertical direction from the neighboring vertex $P_{12}$.

In other words, the positions of the common vertices $P_{21}$ and $P_{22}$ of the trapezoids $T_2$ and $T_3$ are defined by the displacements $\delta_{21}$ and $\delta_{22}$ in the vertical direction from the positions of the common vertices $P_{11}$ and $P_{12}$ of the trapezoids $T_1$ and $T_2$ and the displacement $L_2$ in the horizontal direction.

Similarly, the position of a vertex $P_{m1}$ at a lower end of a side $S_m$ parallel to and next to a side $S_{m-1}$ is defined by a height (distance between the sides $S_{m-1}$ and $S_m$) $L_m$ of a trapezoid $T_m$ and a displacement $\delta_{m1}$ in the vertical direction from a neighboring vertex $P_{(m-1)1}$, and the position of a vertex $P_{m2}$ at an upper end of the side $S_m$ is defined by the height $L_m$ of the trapezoid $T_m$ and a displacement $\delta_{m2}$ in the vertical direction from a neighboring vertex $P_{(m-1)2}$, where m is an integer ranging from two to n.

As described above, the shape of a connection trapezoid group corresponding to a polygonal figure can be defined based on the coordinates (x0, y0) of the figure placement position origin $P_{01}$, the length $L_0$ of the side $S_0$, the heights $L_1$ to $L_n$ of the trapezoids $T_1$ to $T_n$, and the displacements $\delta_{11}$, $\delta_{12}$ to $\delta_{n1}$, and $\delta_{n2}$ in a direction orthogonal to a trapezoid connecting direction from the neighboring vertices. The displacements $\delta_n$, $\delta_{12}$ to $\delta_{n1}$, and $\delta_{n2}$ are signed values. Each of the heights $L_1$ to $L_n$ of the trapezoids $T_1$ to $T_n$ can be regarded as a displacement in the trapezoid connecting direction from the neighboring vertex.

FIG. 7A illustrates an exemplary data structure of write data D1 defining a connection trapezoid group. The write data D1 includes a header PH and shape information EP. In the header PH, a figure code (Code), a flag, and the number of figure elements (N) are defined.

The figure code is information indicating what polygonal figure has been divided into trapezoids connected as a group. For example, the figure code indicates which of the segmentation processes illustrated in FIGS. 3A, 3B, 4A to 4D, 5A, 5B, 6A, and 6B the polygonal figure is associated with.

The flag includes information necessary to identify figure representation, for example, the byte length of data included in the shape information EP, which will be described later. The number of figure elements (N) represents the number of connection trapezoid groups (polygonal figures) having the same figure code. The shape information EP is produced for each connection trapezoid group. If the number of figure elements (N) is greater than or equal to two, a plurality of shape information items EP1 to EPN are produced as illustrated in FIG. 7B.

The shape information EP includes information to define the shape of a connection trapezoid group, for example, the coordinates (x0, y0) of the figure placement position origin, the length $L_0$ of the side $S_0$, the heights $L_1$ to $L_n$ of the trapezoids $T_1$ to $T_n$, and the displacements $\delta_{11}$, $\delta_{12}$ to $\delta_{n1}$, and $\delta_{n2}$ in the direction orthogonal to the trapezoid connecting direction from the neighboring vertices. The shape information EP further includes the number of connected trapezoids Nconnect.

For example, the write data D1 representing the connection trapezoid group illustrated in each of FIGS. 3A and 3B has a data structure as illustrated in FIG. 3C. In the figure code, for example, a trapezoid connecting direction and which vertex is a figure placement position origin are defined distinguishably. The number of connected trapezoids Nconnect is four.

The write data D1 representing the connection trapezoid group in each of FIGS. 4A to 4D has a data structure as illustrated in FIG. 4E. In the figure code, for example, the trapezoid connecting direction, which sides of the trapezoids are aligned so as to form a straight line, and which vertex is a figure placement position origin are defined distinguishably. The number of connected trapezoids Nconnect is four. In each of FIGS. 4A to 4D, sides of the connected trapezoids are aligned so as to form a straight line and there is no displacement in the direction orthogonal to the trapezoid connecting direction between adjacent vertices in each of these sides. If the shape information items EP include the same number of connected trapezoids Nconnect, the data amount of the shape information EP in each of FIGS. 4A to 4D is smaller than that in each of FIGS. 3A and 3B.

The write data D1 representing the connection trapezoid group in each of FIGS. 5A and 5B has a data structure as illustrated in FIG. 5C. In the figure code, for example, segmentation into a plurality of oblongs, an oblong connecting direction, and which vertex is a figure placement position origin are defined distinguishably.

The write data D1 representing the connection trapezoid group in each of FIGS. 6A and 6B has a data structure as illustrated in FIG. 6C. In the shape information EP, a direction flag (flag) is defined as illustrated in FIG. 6D. The reason is as follows: if a polygonal figure has sides extending in the horizontal and vertical directions and sides at 45° to the vertical direction (or the horizontal direction), the sides can be represented by any of the direction flags in FIG. 6D. In the figure code, for example, the trapezoid connecting direction and which vertex is a figure placement position origin are defined distinguishably. FIG. 6C illustrates the write data D1 representing the connection trapezoid group of FIG. 6A.

As described above, according to the embodiment, a polygonal figure is regarded as a connection trapezoid group consisting of a plurality of trapezoids connected in one direction, only a figure placement position origin is indicated by coordinates, and the position (position information) of each of other vertices of the trapezoids is expressed by a displacement from a neighboring vertex to generate write data D1. This allows the write data to have a smaller amount than write data in which each trapezoid is represented by the coordinates of a placement position origin and displacements from the origin to the other three vertices of the trapezoid.

For example, it is assumed that a polygonal figure having 100 vertices is represented as a connection trapezoid group. The data amount of write data in which only a figure placement position origin of one trapezoid is indicated by coordinates as in the embodiment and the position of each of the other vertices of this trapezoid and vertices of the other trapezoids is expressed by a displacement from a neighboring vertex can be reduced to approximately ⅓ of the data amount of write data in which each trapezoid is expressed by the coordinates of a placement position origin and displacements from the origin to the other three vertices.

Furthermore, write data D1 in which a polygonal figure is represented as a connection trapezoid group is more easy to process in the control calculator 52 of the writing apparatus 1 than write data in which a polygonal figure is represented with polygons. This results in a reduction in calculation amount.

Figures 8, 9:
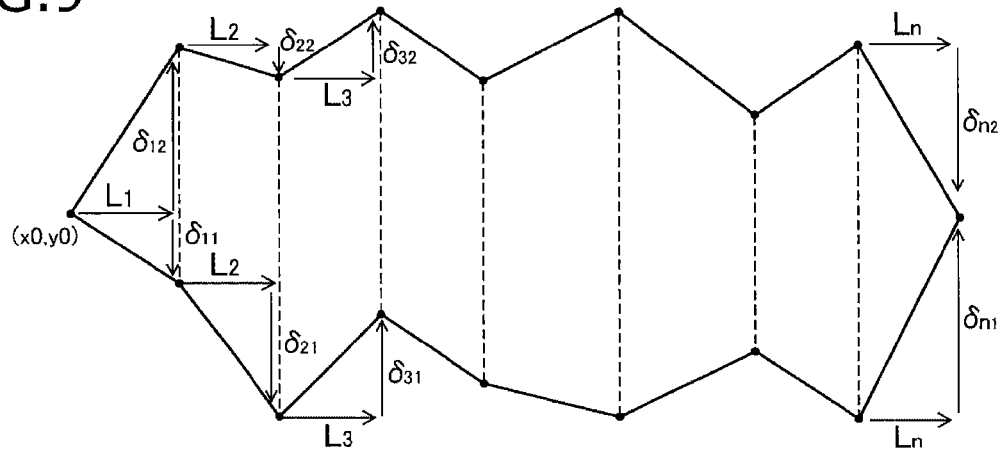
FIG. 8 is a diagram illustrating an exemplary data structure of write data.
FIG. 9 is a diagram illustrating an exemplary polygonal figure segmentation process.

As illustrated in FIG. 8, an amount of radiation (dose) to each of connected trapezoids can be defined in write data D1. A header PHd includes data indicative of doses $AI_1$ to $AI_n$ to the trapezoids $T_1$ to $T_n$. A flag in the header PHd denotes the byte length of the data indicative of the doses $AI_1$ to $AI_n$. The number of elements "N" in the header PHd denotes the number of trapezoids assigned the doses defined. In the write data D1, any other attribute information, such as layer information, may be defined in addition to the amounts of radiation.

As illustrated in FIG. 9, a figure segment corresponding to an end (one or each end) of a connection trapezoid group may have a triangular shape depending on the shape of a polygonal figure. In this case, there is no side corresponding to the side $S_0$. Accordingly, the item about the length $L_0$ is omitted from shape information EP in write data D1.

Figure 10:
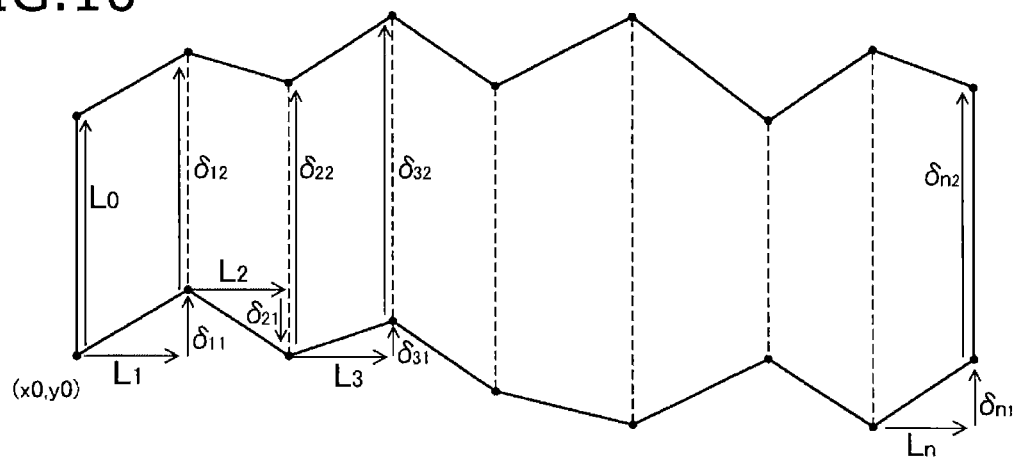
FIG. 10 is a diagram illustrating an exemplary polygonal figure segmentation process.

Although the displacement $\delta_{m1}$ in the vertical direction from the vertex at the lower end of the side $S_{m-1}$ to the vertex at the lower end of the side $S_m$ and the displacement $\delta_{m2}$ in the vertical direction from the vertex at the upper end of the side $S_{m-1}$ to the vertex at the upper end of the side $S_m$ are defined as illustrated in FIG. 2 in the above-described embodiment, the displacement $\delta_{m2}$ may be determined based on the vertex at the lower end of the side $S_m$ as illustrated in FIG. 10. If the position of a vertex at a first end of the side $S_m$ is defined by a displacement from the position of a vertex at a first end of the side $S_{m-1}$ and the position of a vertex at a second end of the side $S_m$ is defined by a displacement from the position of the vertex at the first end of the side $S_m$ in the above-described manner, the same advantages as those in the above-described embodiment can be obtained. The vertex at a first end of a common side of two adjacent trapezoids is used as a reference and a displacement of the vertex at a second end of the common side is defined based on the reference, thus facilitating determination of connection of the adjacent trapezoids during an inspection process.

Figure 11A:
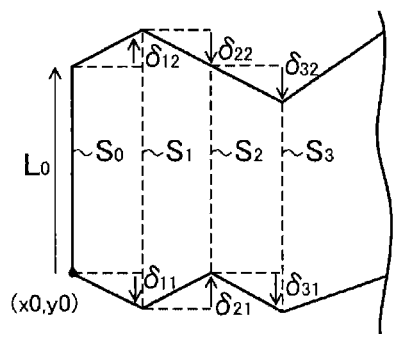
FIGS. 11A and 11B are diagrams each illustrating an exemplary polygonal figure segmentation process.
Figure 11B:
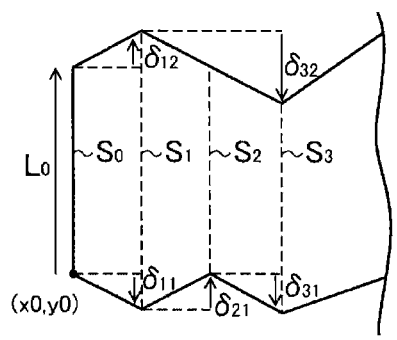

In the above-described embodiment, the position of a vertex at each end of a common side of adjacent trapezoids is expressed by a displacement from a neighboring vertex. According to this method, if first sides of adjacent trapezoids are aligned so as to form a straight line, the position which does not have to be defined, for example, the position of a vertex at an upper end of a common side $S_2$ in FIG. 11A, would be defined by displacements from a neighboring vertex. In this case, it is preferred that the position of the vertex at the upper end of the common side $S_2$ be undefined and the position of a vertex at an upper end of a common side $S_3$ be expressed by displacements from a vertex at an upper end of a common side S1 as illustrated in FIG. 11B. Thus, the data amount of write data D1 can be reduced by an amount corresponding to a displacement $\delta_{22}$ in FIG. 11A.

In this write data D1, as illustrated in FIG. 12A, a flag (flag1) is added to each of the heights $L_1$ to $L_n$ of the trapezoids $T_1$ to $T_n$, and a two-bit value as illustrated in FIG. 12B is given to the flag. Thus, whether the positions of both ends of a common side are defined can be determined.

Furthermore, as illustrated in FIG. 12A, flags (flag2, flag3) may be added to the displacements $\delta_{11}$, $\delta_{12}$ to $\delta_{n1}$, and $\delta_{n2}$, and a two-bit value as illustrated in FIG. 12B may be given to each of the flags. If "flag2" or "flag3" has a value "00" or "10", the displacements $\delta_{11}$, $\delta_{12}$ to $\delta_{n1}$, and $\delta_{n2}$ will be determined based on the heights $L_1$ to $L_n$ of the trapezoids $T_1$ to $T_n$. Consequently, the displacements $\delta_{11}$, $\delta_{12}$ to $\delta_{n1}$, and $\delta_{n2}$ can be omitted in the write data D1. Thus, the data amount of the write data D1 can be further reduced.

Figures 13A, 13B:
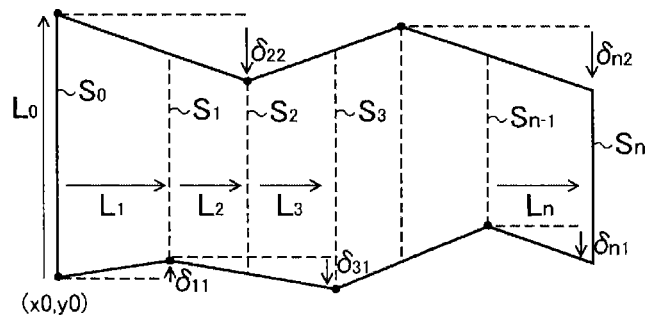
FIG. 13A is a diagram illustrating an exemplary polygonal figure segmentation process and FIG. 13B is a diagram illustrating an exemplary data structure of write data.

For example, write data D1 representing a connection trapezoid group in FIG. 13A has a data structure as illustrated in FIG. 13B. Displacements $\delta_{12}$, $\delta_{21}$, $\delta_{32}$, and the like can be omitted, so that the data amount of the write data D1 can be further reduced.

Figure 14:
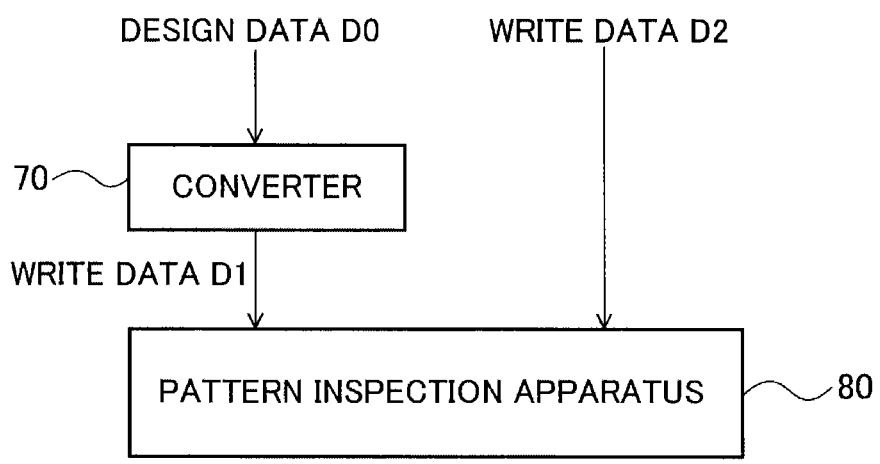
FIG. 14 is a schematic diagram illustrating an exemplary configuration of a pattern inspection apparatus.

The write data D1 generated by the converter 70 in the above-described embodiment may be input to a pattern inspection apparatus. For example, as illustrated in FIG. 14, a pattern inspection apparatus 80 receives write data D1 (first write data) generated by the converter 70 and write data D2 (second write data) produced based on a pattern actually written on a writing target substrate in accordance with the write data D1 by the writing apparatus 1 illustrated in FIG. 1. The write data D2 is input to the pattern inspection apparatus 80 from a memory (not illustrated) via a wired or wireless network.

The pattern inspection apparatus 80 inspects the pattern actually written on the writing target substrate by the writing apparatus 1 based on the received write data items D1 and D2. Such inspection includes, for example, comparison between the write data D1 and the write data D2. In addition, various information about, for example, writing conditions, is used for inspection.

The write data D1 generated by the converter 70 is a small amount of data and is easy to process, leading to increased processing efficiency of the pattern inspection apparatus 80.

The converter 70 may be included in the pattern inspection apparatus 80. In this case, the pattern inspection apparatus 80 may include a conversion unit that generates write data D1 based on input design data D0 and an inspection unit that compares the write data D1 and write data D2 to inspect a pattern actually written on a writing target substrate.

Write data D1 in the above-described embodiment may be generated in the control calculator 52 of the writing apparatus 1. Upon reception of design data D0, the control calculator 52 may divide a polygonal figure into parallel trapezoids to produce a connection trapezoid group, and express the position of each vertex by using a displacement from the position of a neighboring vertex to generate write data D1.

At least part of the converter 70 described in the above embodiments may be implemented in either hardware or software. When implemented in software, a program that realizes at least part of functions of the converter 70 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the converter 70 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of generating write data for a multi charged particle beam writing apparatus, the method comprising:
   dividing a polygonal figure included in design data into a plurality of trapezoids each having a pair of parallel opposite sides extending in a first direction and at least one pair of non-parallel opposite sides, the trapezoids being connected in a second direction orthogonal to the first direction such that adjacent trapezoids share the side extending in the first direction as a common side;
   generating the write data including position information of a common vertex of a first trapezoid and a second trapezoid next to the first trapezoid expressed by a displacement in the first and second directions from a position of a common vertex of the second trapezoid and a third trapezoid next to the second trapezoid; and
   controlling the multi charged particle beam writing apparatus using the generated write data.

2. The method according to claim 1, wherein the write data includes attribute information associated with each trapezoid.

3. The method according to claim 1, wherein the write data includes information indicating the second direction in which the trapezoids are connected, coordinates of a figure placement position origin, and a height of each trapezoid.

4. The method according to claim 3, wherein the write data includes
   position information of a first vertex at a first end of a first common side of the first and second trapezoids expressed by a displacement from a third vertex at a first end of a second common side of the second and third trapezoids, and
   position information of a second vertex at a second end of the first common side expressed by a displacement from a fourth vertex at a second end of the second common side.

5. The method according to claim 4, wherein the write data includes
   position information of the third vertex expressed by a displacement from a fifth vertex at a first end of a third common side of the third trapezoid and a fourth trapezoid next to the third trapezoid, and
   position information of the fourth vertex expressed by a displacement from a sixth vertex at a second end of the third common side, wherein the position information of the first vertex is expressed by displacements from the fifth vertex when one side of the second trapezoid between the first and third vertices and one side of the third trapezoid between the third and fifth vertices are aligned so as to form a straight line, with a flag indicating that the position of the third vertex is undefined.

6. The method according to claim 3, wherein the write data includes
position information of a first vertex at a first end of a first common side of the first and second trapezoids expressed by a displacement from a second vertex at a second end of the first common side,
position information of a third vertex at a first end of a second common side of the second and third trapezoids expressed by a displacement from a fourth vertex at a second end of the second common side, and
position information of the second vertex expressed by a displacement from the fourth vertex.

7. The method according to claim 1, wherein the polygonal figure is divided in such a manner that a figure segment corresponding to one or each end in the second direction of the polygonal figure has a triangular shape.

8. The method according to claim 1, wherein the write data includes information indicative of an amount of radiation to each trapezoid.

9. A multi charged particle beam writing apparatus comprising:
a writing unit that forms multiple beams including a plurality of charged particle beams, individually allows the multiple beams to enter an ON mode or an OFF mode, and irradiates an object with the charged particle beams to write a pattern, and
a control unit that
divides a polygonal figure included in design data into a plurality of trapezoids each of which has at least one pair of parallel opposite sides extending in a first direction and at least one pair of non-parallel opposite sides and which are connected in a second direction orthogonal to the first direction such that adjacent trapezoids share the side extending in the first direction as a common side,
generates the write data including position information of a common vertex of a first trapezoid and a second trapezoid next to the first trapezoid expressed by a displacement in the first and second directions from a position of a common vertex of the second trapezoid and a third trapezoid next to the second trapezoid, and
controls the writing unit in accordance with the write data.

10. The apparatus according to claim 9, wherein the write data includes information indicating the second direction in which the trapezoids are connected, coordinates of a figure placement position origin, and a height of each trapezoid.

11. The apparatus according to claim 10, wherein the write data includes
position information of a first vertex at a first end of a first common side of the first and second trapezoids expressed by a displacement from a third vertex at a first end of a second common side of the second and third trapezoids, and
position information of a second vertex at a second end of the first common side expressed by a displacement from a fourth vertex at a second end of the second common side.

12. The apparatus according to claim 11, wherein the write data includes
position information of the third vertex expressed by a displacement from a fifth vertex at a first end of a third common side of the third trapezoid and a fourth trapezoid next to the third trapezoid, and
position information of the fourth vertex expressed by a displacement from a sixth vertex at a second end of the third common side,
wherein the position information of the first vertex is expressed by displacements from the fifth vertex when one side of the second trapezoid between the first and third vertices and one side of the third trapezoid between the third and fifth vertices are aligned so as to form a straight line, with a flag indicating that the position of the third vertex is undefined.

13. The apparatus according to claim 10, wherein the write data includes
position information of a first vertex at a first end of a first common side of the first and second trapezoids expressed by a displacement from a second vertex at a second end of the first common side,
position information of a third vertex at a first end of a second common side of the second and third trapezoids expressed by a displacement from a fourth vertex at a second end of the second common side, and
position information of the second vertex expressed by a displacement from the fourth vertex.

14. The apparatus according to claim 9, wherein the control unit divides the polygonal figure in such a manner that a figure segment corresponding to one or each end in the second direction of the polygonal figure has a triangular shape.

15. A pattern inspection apparatus comprising:
a conversion unit
that divides a polygonal figure included in design data into a plurality of trapezoids each of which has at least one pair of parallel opposite sides extending in a first direction and at least one pair of non-parallel opposite sides and which are connected in a second direction orthogonal to the first direction such that adjacent trapezoids share the side extending in the first direction as a common side, and
generates first write data including expresses position information of a common vertex of a first trapezoid and a second trapezoid next to the first trapezoid expressed by a displacement in the first and second directions from a position of a common vertex of the second trapezoid and a third trapezoid next to the second trapezoid, and
an inspection unit that compares the first write data and second write data produced based on a pattern written on an object by irradiation with charged particle beams to inspect the pattern.

16. The apparatus according to claim 15, wherein the first write data includes information indicating the second direction in which the trapezoids are connected, coordinates of a figure placement position origin, and a height of each trapezoid.

17. The apparatus according to claim 16, wherein the write data includes
position information of a first vertex at a first end of a first common side of the first and second trapezoids expressed by a displacement from a third vertex at a first end of a second common side of the second and third trapezoids, and position information of a second vertex at a second end of the first common side expressed by a displacement from a fourth vertex at a second end of the second common side.

18. The apparatus according to claim 17, wherein the write data includes
position information of the third vertex expressed by a displacement from a fifth vertex at a first end of a third common side of the third trapezoid and a fourth trapezoid next to the third trapezoid, and
position information of the fourth vertex expressed by displacement from a sixth vertex at a second end of the third common side,
wherein the position information of the first vertex is expressed by displacements from the fifth vertex when one side of the second trapezoid between the first and third vertices and one side of the third trapezoid between the third and fifth vertices are aligned so as to form a straight line, with a flag indicating that the position of the third vertex is undefined.

19. The apparatus according to claim 16, wherein the write data includes
position information of a first vertex at a first end of a first common side of the first and second trapezoids expressed by a displacement from a second vertex at a second end of the first common side,
position information of a third vertex at a first end of a second common side of the second and third trapezoids expressed by a displacement from a fourth vertex at a second end of the second common side, and
position information of the second vertex expressed by a displacement from the fourth vertex.

20. The apparatus according to claim 15, wherein the conversion unit divides the polygonal figure in such a manner that a figure segment corresponding to one or each end in the second direction of the polygonal figure has a triangular shape.

* * * * *